(12) United States Patent
Zhang

(10) Patent No.: US 9,237,651 B2
(45) Date of Patent: Jan. 12, 2016

(54) PADLESS VIA

(71) Applicant: Broadcom Corporation, Irvine, CA (US)

(72) Inventor: Tonglong Zhang, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/565,383

(22) Filed: Dec. 9, 2014

(65) Prior Publication Data
US 2015/0092381 A1  Apr. 2, 2015

Related U.S. Application Data

(62) Division of application No. 11/652,735, filed on Jan. 12, 2007, now abandoned.

(51) Int. Cl.
| | |
|---|---|
| *H01L 21/44* | (2006.01) |
| *H05K 1/11* | (2006.01) |
| *H05K 3/42* | (2006.01) |
| *H05K 1/09* | (2006.01) |
| *H05K 1/18* | (2006.01) |

(52) U.S. Cl.
CPC .................. *H05K 1/115* (2013.01); *H05K 1/09* (2013.01); *H05K 1/181* (2013.01); *H05K 3/423* (2013.01); *H05K 3/427* (2013.01); *H05K 2201/09545* (2013.01); *Y10T 29/49165* (2015.01)

(58) Field of Classification Search
CPC ......... H05K 1/09; H05K 1/115; H05K 1/181; H05K 2201/09545; H05K 3/423; H05K 3/427; Y10T 29/49165
See application file for complete search history.

(56) References Cited

U.S. PATENT DOCUMENTS

| | | | | |
|---|---|---|---|---|
| 3,798,136 | A * | 3/1974 | Olsen et al. .................... | 205/131 |
| 4,556,759 | A * | 12/1985 | Iadarola ......................... | 174/262 |
| 2003/0057550 | A1* | 3/2003 | Zhao et al. ..................... | 257/734 |
| 2003/0102151 | A1* | 6/2003 | Hirose et al. .................. | 174/250 |
| 2004/0084210 | A1* | 5/2004 | Dishongh et al. ............. | 174/260 |
| 2005/0032273 | A1 | 2/2005 | Chang et al. | |
| 2006/0040494 | A1* | 2/2006 | Hiatt .............................. | 438/667 |
| 2006/0043598 | A1* | 3/2006 | Kirby ..................... | B82Y 10/00 257/774 |
| 2008/0067679 | A1* | 3/2008 | Takagi et al. .................. | 257/751 |

* cited by examiner

*Primary Examiner* — Shaun Campbell
(74) *Attorney, Agent, or Firm* — McDermott Will & Emery LLP

(57) ABSTRACT

One disclosed embodiment comprises formation of a padless via in a substrate. The padless via includes a hole through a metal layer blanketing the substrate, as well as the underlying substrate. An inner wall of the padless via hole receives a seed layer of a conductive material. Electrolytic differential plating is then performed, resulting in a preferential accumulation of a conductive plating material on the via inner wall, relative to that deposited on a surface of the substrate. In one embodiment, the differential plating is performed by addition of an organic suppressant to a plating bath.

17 Claims, 7 Drawing Sheets

PADLESS VIA

CROSS-REFERENCE TO RELATED APPLICATION

This application is a divisional application of U.S. patent application Ser. No. 11/652,735, entitled "PADLESS VIA AND METHOD FOR MAKING SAME," filed Jan. 12, 2007, the entire content of which is incorporated herein by reference.

BACKGROUND OF THE INVENTION

1. Field of the Invention

The present invention is generally in the field of electronic arts. More specifically, the invention is in the field of packaging of electronic components and devices.

2. Background Art

As electronic devices become more integrated with increased functionality and higher levels of performance, the complexity of the packaging structures, for example, die package substrates and circuit boards (each phrase "die package substrate" and "circuit board" is also generally referred to as a "substrate" in the present application), that are used to effectuate signal transmission has grown. As a further result of the increase in functionality and performance, the density of interconnects used in die package substrates and circuit boards has increased as well. Progress towards greater circuit density and higher performance has been achieved in part through the introduction of multi-layered die package substrates and circuit boards and the use of vias in these die package substrates and circuit boards.

Vias are electrically conductive structures extending through a die package substrate or a circuit board. As known in the art, a via provides a conductive path for a signal traveling from one surface to another surface of a dielectric layer, or between different surfaces in a multi-layered die package substrate or circuit board. Such a path is typically established by depositing a layer of conductive material onto the inner wall of a via hole.

In conventional techniques, the conductive material on the inner wall of the via is protected during later patterning of the die package substrate or circuit board surface, by introduction of a photoresist plug over the via hole. Reliance on a photoresist plug during patterning results in retention on the die package substrate or circuit board surface of a perimeter region made up of a conductive material that surrounds the opening of each via hole. These perimeter regions, also referred to as via pads, are undesirable for a number of reasons. For example, via pads occupy space otherwise allocable to interconnect traces which connect circuit components, and they also present an obstacle to flexibility in designing and patterning the interconnect traces and make signal routing less efficient.

In a conventional padded via, the via pad may represent a large percentage, for example more than 60%, of the total lateral area consumed by a via. Elimination of the via pad represents a substantial decrease in the surface footprint of the via, with corresponding enhancements in both available surface space and interconnect routing flexibility and efficiency. Simply stated, reduction or elimination of via pads makes possible significant improvements in the functionality and performance of existing die package substrates and circuit boards. Moreover, smaller die package substrates and circuit boards are possible, which result in flexibility in system design and substantial cost savings.

SUMMARY OF THE INVENTION

A padless via and method for making same substantially as shown in and/or described in connection with at least one of the figures, as set forth more completely in the claims.

DETAILED DESCRIPTION OF THE INVENTION

Figure 1A:
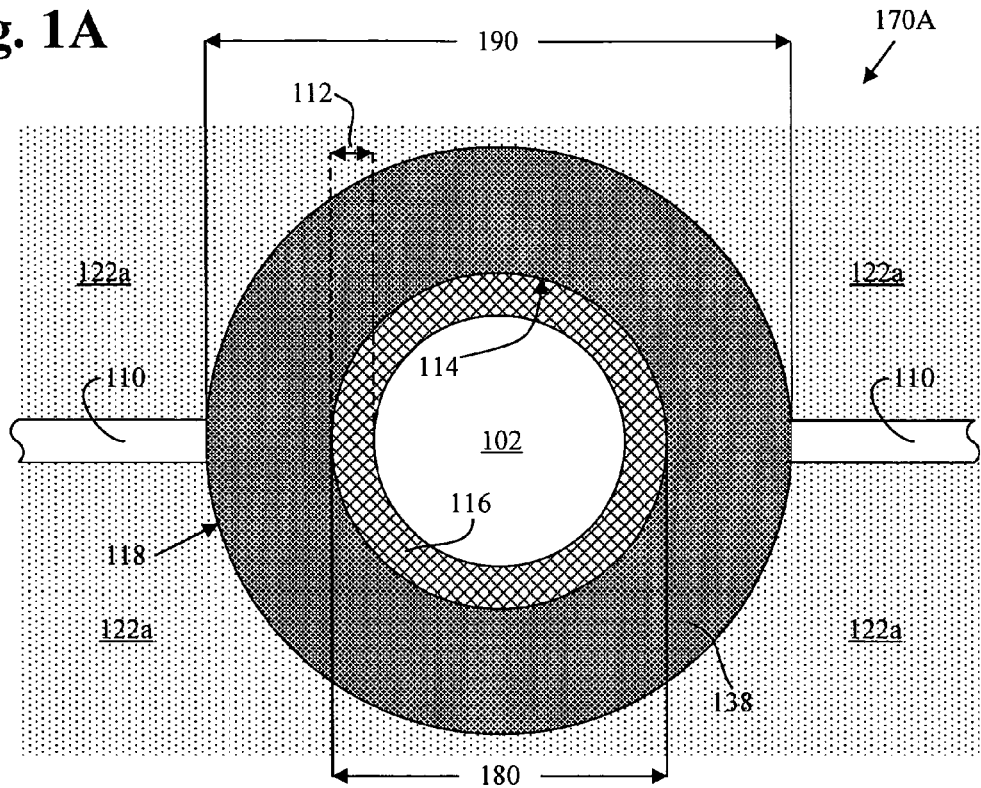
FIGS. 1A and 1B show top and cross-sectional views of a conventional padded via.

The present invention is directed to a padless via and method for making same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

A via is an electrically conductive structure extending through a die package substrate or a circuit board. It may be thermally as well as electrically conductive. As known in the art, a via provides a conductive path for a signal traveling from one surface to another surface of a dielectric layer, or between different surfaces in a multi-layered die package substrate or circuit board. Such a path is typically established by depositing a layer of conductive material onto the inner wall of a via hole. The conductive material applied to the inner wall may be deposited electrically, chemically, or by some other means. Suitable materials include but are not limited to, copper, aluminum, gold, molybdenum, tungsten, other metals, or combinations/alloys of those metals.

In conventional techniques for making vias, for example on a circuit board comprising a substrate and a metal laminate (i.e. a blanket metal layer), a number of via holes are drilled through the circuit board. Electrical contact between the blanket metal layer and other conductive layers within or on the opposing side of the circuit board is established by application of a thin seed layer of conductive material to the inner wall of each via hole. In a typical process, the seed layer may be copper, applied electrolessly in a plating bath, in such a way that the seed layer is deposited over the entire substrate surface as well as along each via inner wall.

Following establishment of electrical connection between the conductive layers of a circuit board, a more robust layer of conducting material is applied, typically through electrolytic plating. As was true for application of the seed layer, the plating layer is applied in roughly equal thickness to the inner wall of each via, and to the lateral surface of the circuit board. Thus, upon completion of the plating process, the inner wall of each via carries an accumulated layer of conductive material composed of the nominal seed layer plus the plating layer applied electrolytically. By contrast, the circuit board's lateral surface carries the accumulation of its own blanket layer (i.e. the metal laminate) in addition to the two layers applied to the inner wall of each via. As a result, in conventional techniques for via formation, the circuit board lateral surface carries a thicker conductive layer than that present on the inner wall of each via hole, at the time surface patterning occurs.

In order to preserve the conductive lining on the walls of each via hole during application of etchant(s) to pattern the surface of the circuit board, each via hole is covered, or plugged, with a mask such as photoresist. For a via hole to be adequately protected, its plug must completely overlap it, and consequently the plug extends to a surface perimeter beyond the boundary established by the via hole. In so doing, it defines an overlay perimeter region, or via pad, in which region the surface conductive layer is protected and retained during the patterning step, and the via pad will thus remain in the final trace pattern on the circuit board.

The conventional via formation process described results in a via surrounded by a perimeter region of excess conducting material, or a padded via. For each such padded via, the surface area of the pad itself may be responsible for a large percentage, for example more than 60%, of the total lateral surface area occupied by the via (the total lateral space being also referred to as "total via footprint" in the present application).

Structure 170A in FIG. 1A illustrates a top view of a single conventional padded via and the resulting surface area occupied by it on substrate surface 122a, which can be a surface of a circuit board or a die package substrate. Distance 180 represents the diameter of the circular area occupied on substrate surface 122a by the circular boundary of via hole 102. In some cases, the via hole may be entirely filled with conductive material. In others, as is the case in structure 170A, a portion of the via hole remains unfilled. The conductive material deposited on inner wall 114 of via hole 102 during the seeding and plating processes accumulates to form conductive lining 116, which has thickness 112. Prior to patterning of substrate surface 122a on which via hole 102 opens, a plug of patterning mask such as photoresist is applied to overlay via hole 102, as well as to form an extension region beyond via hole 102, leaving a total via footprint with diameter 190. Following the patterning step, substrate surface 122a is unmasked to reveal conductive tracings 110, and via pad 138 resulting from the extended overlay region masked during patterning, and enclosed by perimeter 118. As stated above, via pad 138 together with via hole 102 result in a padded via with a total via footprint with a total diameter 190.

Figure 1B:
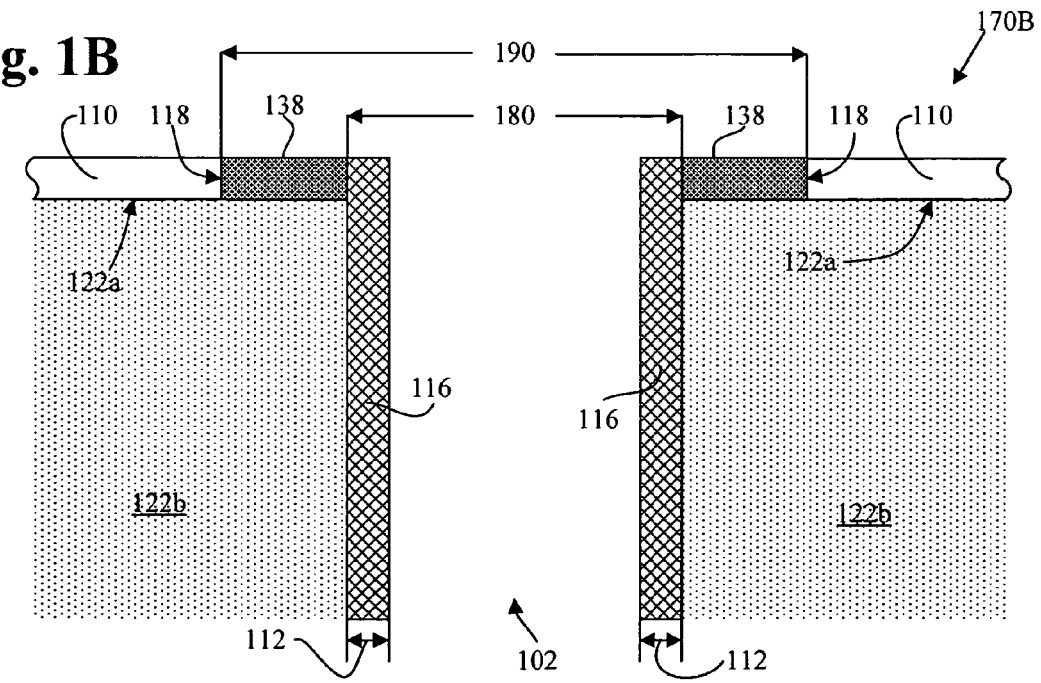

Structure 170B in FIG. 1B illustrates a cross-sectional view of the conventional padded via of FIG. 1A, comprising via hole 102 and via pad 138. FIG. 1B provides additional perspective on the excess substrate surface area occupied by the pad in a conventional padded via. As in previous FIG. 1A, distance 180 represents the diameter of via hole 102, a portion of which is filled as a result of the presence of conductive lining 116 having thickness 112. At substrate surface 122a of substrate bulk 122b, conductive lining 116 defines an inner conductive ring of thickness 112. Surrounding the inner conductive ring defined by conductive lining 116, via pad 138 defines an outer conductive ring bounded by perimeter 118. Thus, as shown in FIGS. 1A and 1B, via pad 138 occupies a conductive buffer region connecting conductive tracings 110 to the inner conductive ring defined by conductive lining 116.

As stated above, the total substrate surface area occupied by a padded via, that is the sum of the surface area corresponding to the via hole and the area occupied by the via pad, is referred to as the total via footprint in the present application. Thus, the total via footprint of the padded via shown in FIGS. 1A and 1B is proportional to the square of diameter 190. By comparison, the substrate area occupied by via hole 102, including the area occupied by the inner conductive ring defined by conductive lining 116, is proportional to the square of diameter 180. In conventional methods of via formation, diameter 180 may be as great as 200 microns, with via pad overlay tolerances as liberal as 75 microns or more, resulting in a footprint diameter 190 of as much as 350 microns or more. Under these circumstances, comparison of the substrate surface area occupied by the total padded via footprint with that occupied by a "padless via," i.e. a via comprising only via hole 102 with conductive lining 116 and without via pad 138, reveals that only about ⅓ of the total footprint is occupied by via hole 102 and conductive lining 116, while roughly ⅔ of the total footprint is merely due to the presence of via pad 138. Thus, the presence of via pad 138 causes the total via footprint of the conventional padded via to be three times greater than the total via footprint of the same via, if it were padless.

Figure 2:
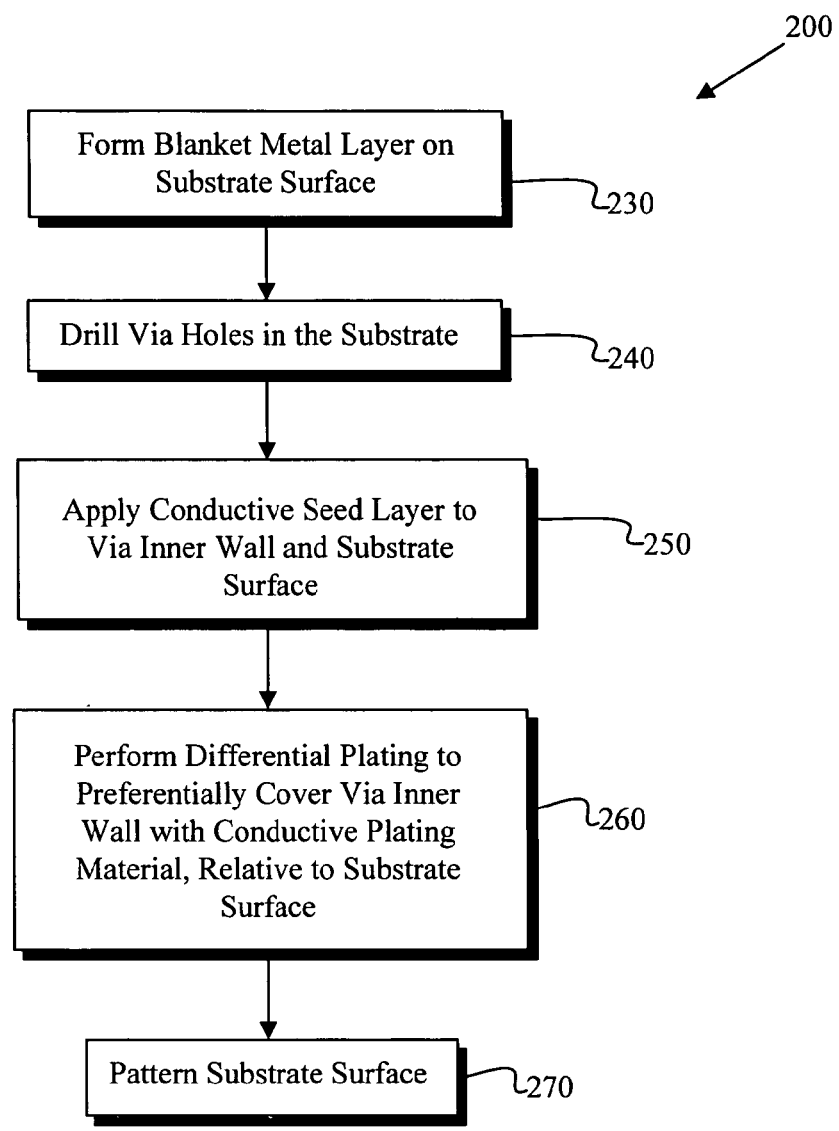
FIG. 2 is a flow chart of an exemplary method to implement an embodiment of the present invention.

FIG. 2 shows flow chart 200, which describes the steps, according to one embodiment of the present invention, in the formation of a padless via. Certain details and features have been left out of flow chart 200 that are apparent to a person of ordinary skill in the art. For example, a step may consist of one or more substeps or may involve specialized equipment or materials, as known in the art. While steps 230 through 270 indicated in flow chart 200 are sufficient to describe one embodiment of the present invention, other embodiments of the invention may utilize steps different from those shown in flow chart 200.

Figure 3:
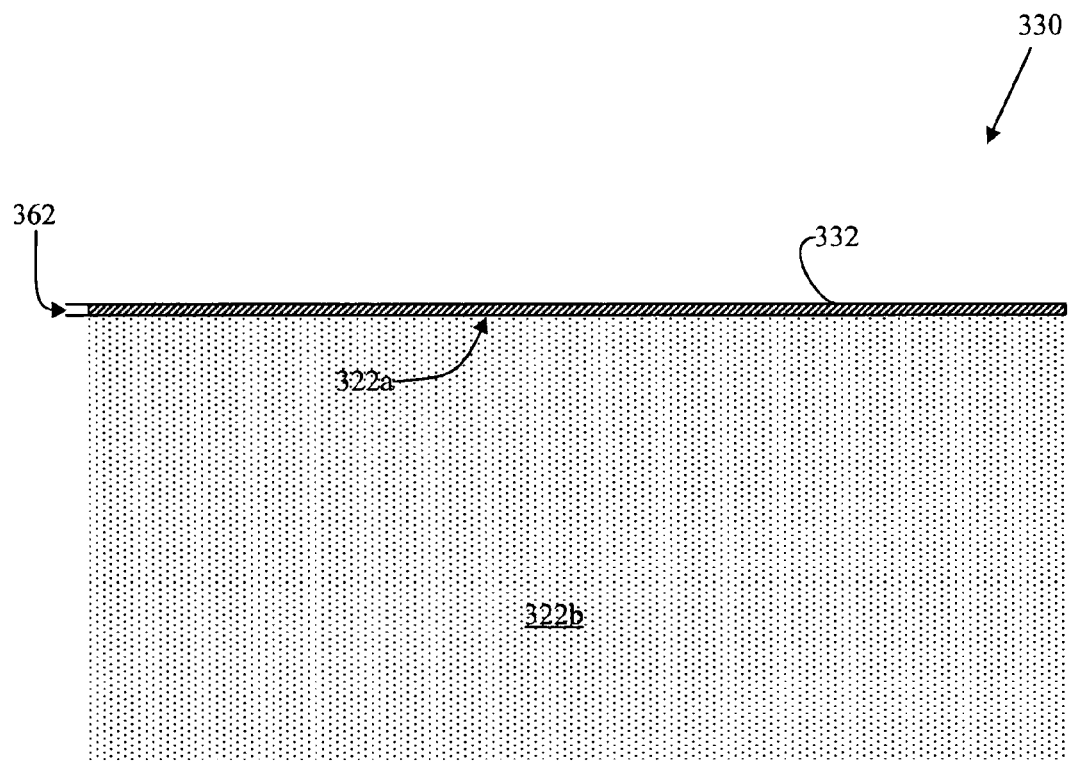
FIG. 3 shows an exemplary structure corresponding to an initial step in the flow chart of FIG. 2.

The steps shown in flow chart 200 are performed on a substrate which initially includes only substrate surface 322a and substrate bulk 322b shown in FIG. 3 (where blanket metal layer 332 is formed after step 230 is completed). Substrate bulk 322b can comprise, for example, a multi-layer organic laminate such as polytetrafluoroethylene, other organic materials such as FR-4 based laminate, and/or ceramic materials.

Structure 330 of FIG. 3 is a cross sectional view of a substrate on which blanket metal layer 332 is formed on substrate surface 322a according to preliminary step 230 of flow chart 200 in FIG. 2. Blanket metal layer 332 may comprise copper, and may have thickness 362 of, for example, 12 microns in some embodiments. However, blanket metal layer 332 may comprise other metals and have other thicknesses.

Figure 4A:
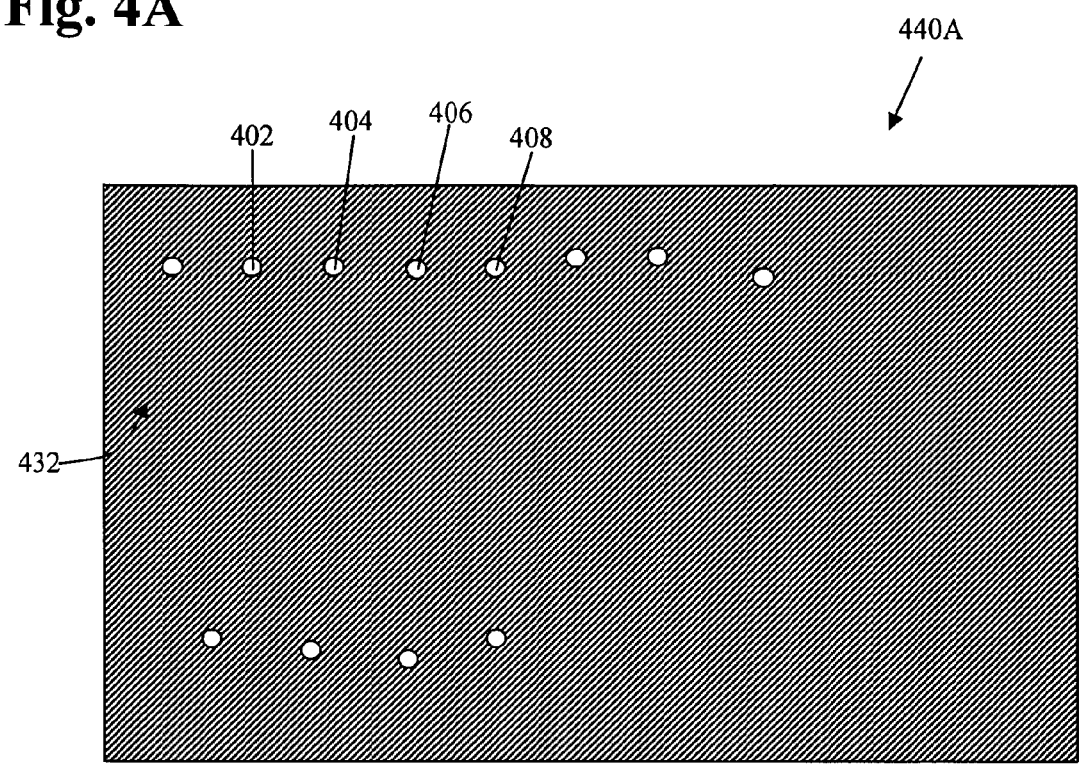
FIGS. 4A and 4B show top and cross-sectional views of an exemplary structure corresponding to an intermediate step in the flow chart of FIG. 2.
Figure 4B:
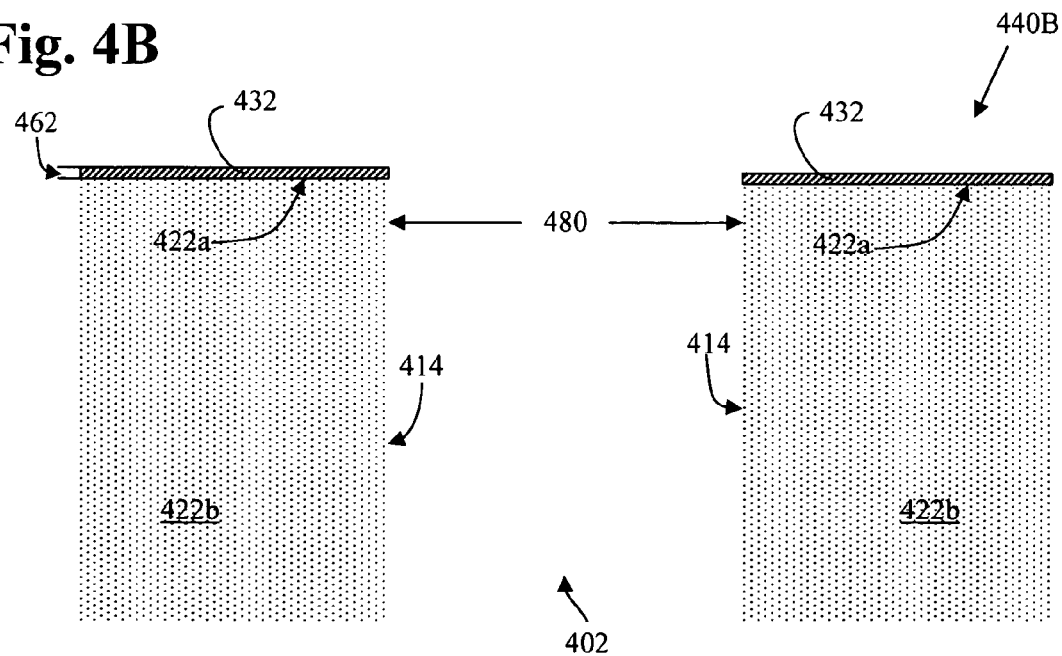

Continuing with step 240 in FIG. 2 and structures 440A in FIG. 4A and 440B in FIG. 4B, via holes are drilled through blanket metal layer 432 and into substrate surface 422a and substrate bulk 422b. Structure 440A of FIG. 4A illustrates a top view of a circuit board in which a number of via holes, such as via holes 402, 404, 406, and 408, have been formed according to step 240 of the flow chart of FIG. 2.

Referring now to FIG. 4B, structure 440B shows a portion of structure 440A of FIG. 4A, including via hole 402 having diameter 480. For ease of illustration, other via holes are not shown in structure 440B. Structure 440B thus shows the portion of substrate surface 422a and substrate bulk 422b which includes via hole 402 having via inner wall 414, and sections of substrate surface 422a on which blanket metal layer 432 having thickness 462 has been formed.

Figure 5:
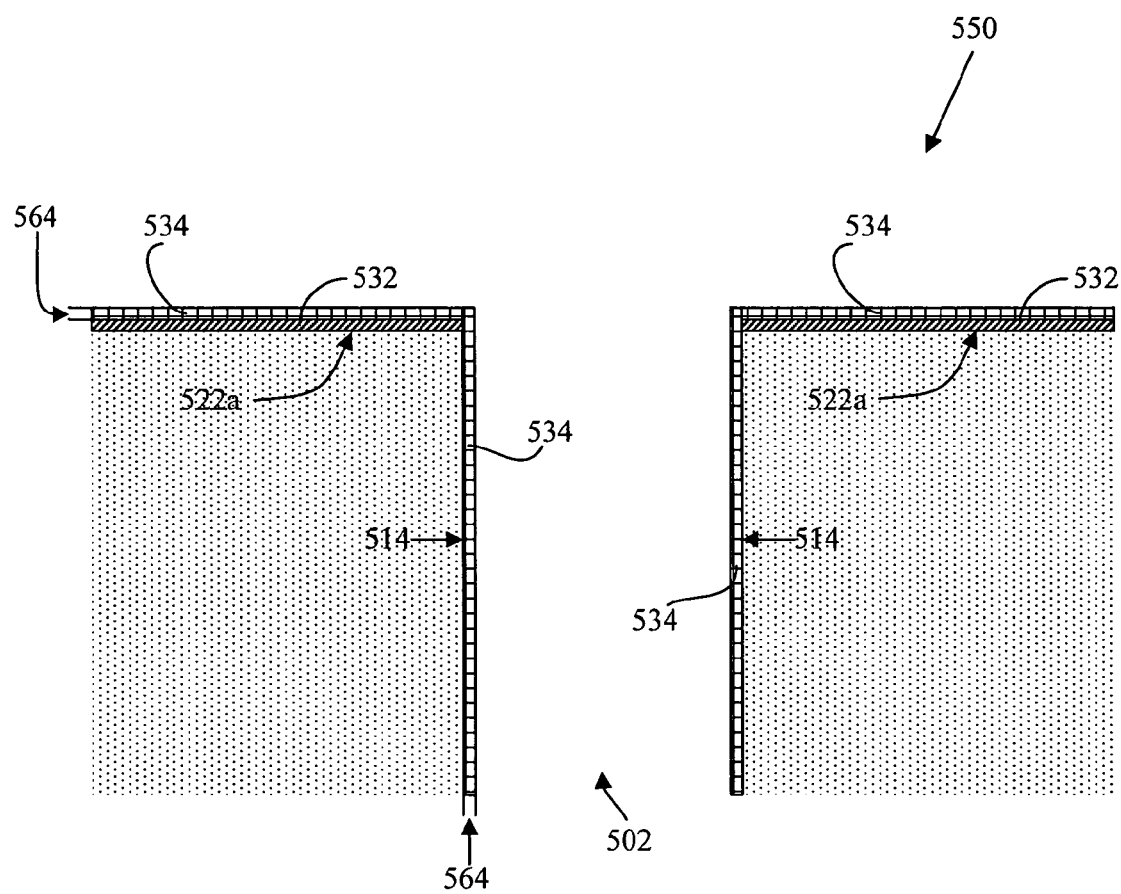
FIG. 5 shows an exemplary structure corresponding to an intermediate step in the flow chart of FIG. 2.

Continuing with step 250 in FIG. 2 and structure 550 in FIG. 5, a seed layer of conductive material, such as copper or a copper alloy, is applied to via inner wall 514 and blanketed substrate surface 522a. For example, the seed layer may be applied electrolessly, through deposition of a metal layer by means of a reducing chemical bath. Alternatively, it is possible to form the seed layer electrolytically in a manner known in the art. Thus, structure 550 represents structure 440B in FIG. 4B, after application of a seed layer. As shown in FIG. 5, seed layer 534 having thickness 564 has been applied to blanket metal layer 532 and inner via wall 514 of via hole 502.

Figure 6:
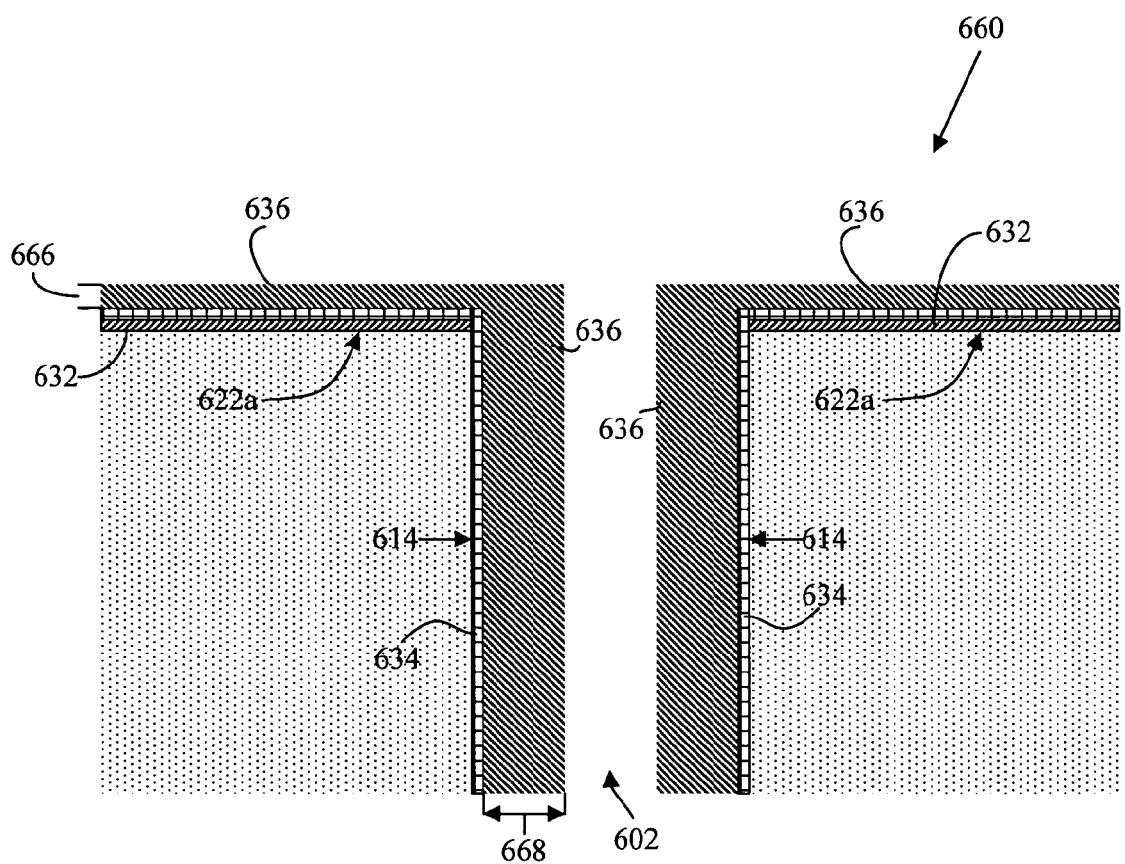
FIG. 6 shows an exemplary structure corresponding to an intermediate step in the flow chart of FIG. 2.

Continuing with step 260 in FIG. 2 and structure 660 in FIG. 6, differential plating of a conductive material, such as copper or a copper alloy, is performed over seed layer 634 situated over blanket metal layer 632 and via inner wall 614 of via hole 602. In one embodiment, differential plating is achieved through addition of an organic suppressant to an electrolytic plating bath. In one exemplary implementation, a plating differential rate may be adjusted by changing the bias used during the electrolytic plating process. As a result, conductive material is preferentially plated onto the portion of the seed layer situated over via inner wall 614, relative to the portion of the seed layer situated over blanket metal layer 632 such that a thicker layer of the conductive plating material is formed on via inner wall 614 and a thinner layer is formed over substrate surface 622a. Structure 660 in FIG. 6 illustrates via hole 602 after differential plating has occurred according to step 260 of flow chart 200. Thus, plating layer 636 is formed over both blanket metal layer 632 and via inner wall 614, but plating layer 636 accumulates an inner wall plating thickness 668 greater than thickness 666 deposited over substrate surface 622a. It is noted that in one embodiment the differential plating is performed to such a degree and effect that it is akin to anisotropic plating. In other words, differential plating may be performed such that the conductive material is plated in one direction only, i.e. only on via inner wall 614, and not on substrate surface 622a.

Unlike conventional methods for via formation, patterning of substrate surface 622a in FIG. 6 proceeds without use of a protective plug overlaying via hole 602. Unprotected patterning may occur during practice of the present invention, without risk of complete removal of plating layer 636 on via inner wall 614. During unprotected patterning, conductive plated material is completely etched away from unmasked regions of plating layer 636 situated over substrate surface 622a. However, since plating layer 636 has a greater thickness 668 over via inner wall 614 than thickness 666 over substrate surface 622a, thickness 668 of plating layer 636 over via inner wall 614 is merely reduced during etching, but conductive plating 636 is not eliminated from, and remains on, via inner wall 614, while the accumulated layers 632, 634 and 636 are completely removed from unprotected regions of substrate surface 622a. In other words, the accumulated blanket metal layer 632, seed layer 634, and plating layer 636 are completely removed from unprotected regions of substrate surface 622a.

Figure 7A:
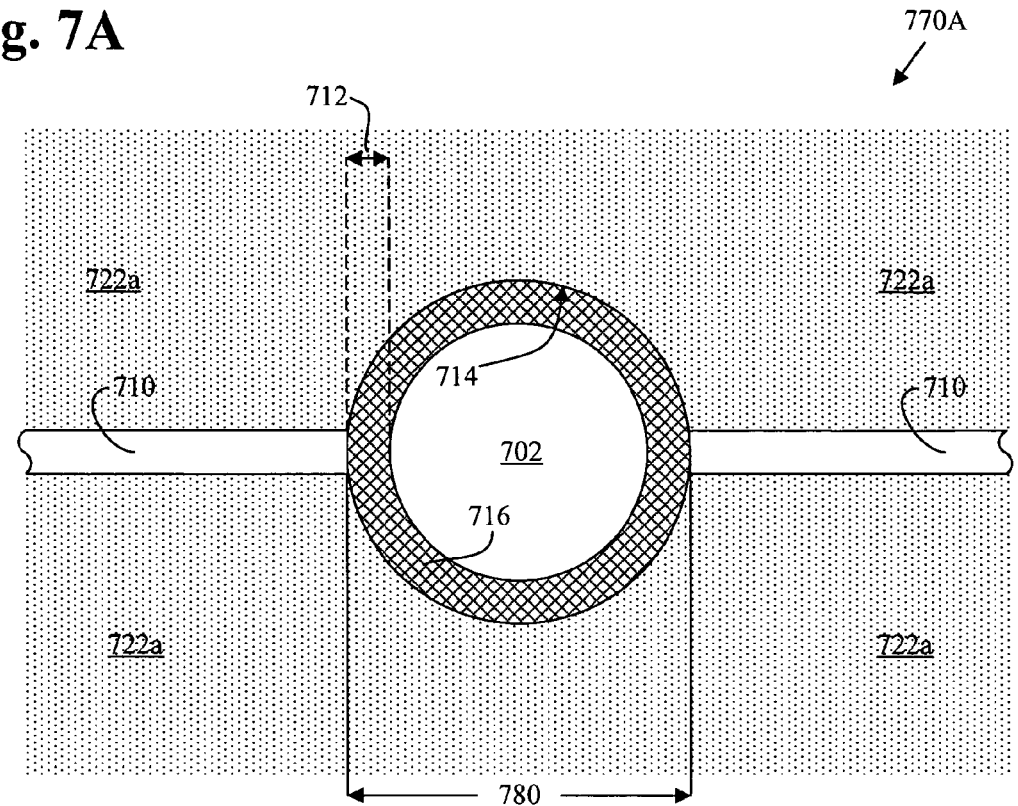
FIGS. 7A and 7B show top and cross-sectional views of an exemplary structure corresponding to a final step in the flow chart of FIG. 2.
Figure 7B:
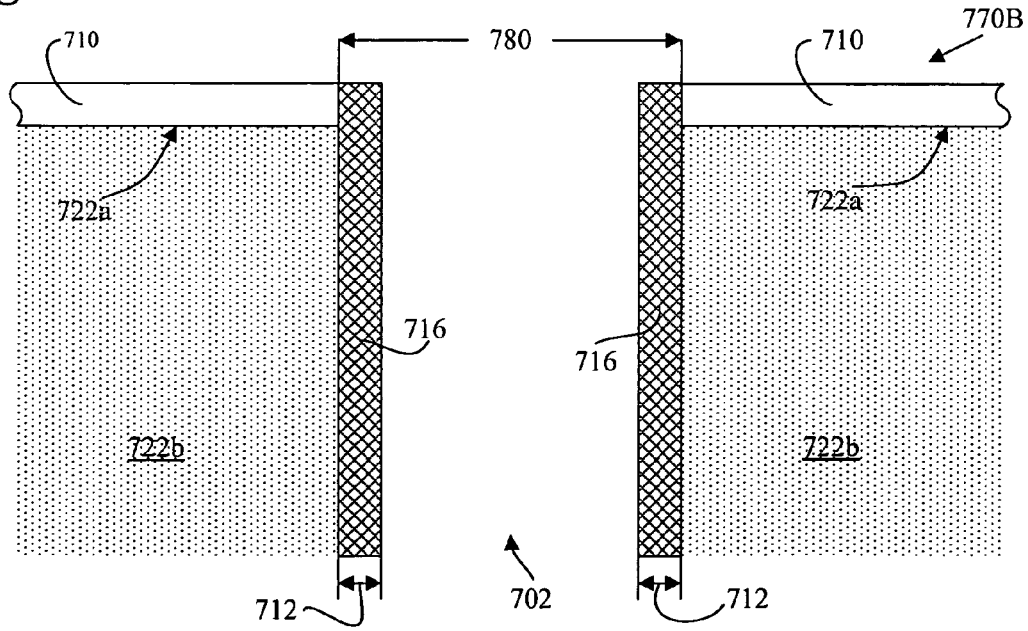

Continuing with step 270 in FIG. 2, structure 770A of FIG. 7A illustrates a top view of a region on the circuit board surrounding via hole 702 after patterning has occurred. Structure 770B of FIG. 7B illustrates the cross-sectional view of via hole 702 corresponding to the top view of FIG. 7A. In structures 770A and 770B, substrate surface 722a, substrate bulk 722b, conductive tracings 710, inner wall 714 of via hole 702, conductive lining 716 of via hole 702, distance 780 representing the diameter of via hole 702, and thickness 712 of conductive lining 716 correspond respectively to substrate surface 122a, substrate bulk 122b, conductive tracings 110, inner wall 114 of via hole 102, conductive lining 116 of via hole 102, distance 180 representing the diameter of via hole 102, and thickness 112 of conductive lining 116 of structures 170A and 170B of FIGS. 1A and 1B. Moreover, the inner conductive ring defined by conductive lining 716 of via hole 702 in FIG. 7A corresponds to the inner conductive ring defined by conductive lining 116 of via hole 102 in FIG. 1A. As shown in FIGS. 7A and 7B, due to the absence of via pad 138 of FIGS. 1A and 1B, conductive tracings 710 are directly connected to conductive lining 716 of the padless via of the present invention.

Comparison of exemplary structures 770A and 770B of the invention's padless via with corresponding structures 170A and 170B of a conventional padded via illustrates the reduction in the total via footprint that is achieved by the present invention. As shown in FIGS. 7A and 7B, via pad 138, that is present in the conventional padded via of FIGS. 1A and 1B, is entirely eliminated by the present invention. Referring to FIGS. 6, 7A, and 7B, due to the differential plating technique resulting in plating layer 636 having a greater thickness 668 over via inner wall 614 than thickness 666 over substrate surface 622a, plating layer 636 is not eliminated from via inner wall 614, and remains on conductive lining 716 of via hole 702 in the final structures 770A and 770B shown in FIGS. 7A and 7B.

Thus, since there is no need for protecting the conductive via inner wall 614 from being eliminated, protective via pad 138, which was a necessary result of the conventional scheme for protection of the conductive via inner walls, is not needed and does not exist in the final structures 770A and 770B of the present invention. As such, the total via footprint in the present invention is advantageously limited to distance 780 representing the diameter of via hole 702. By contrast, the total via footprint in the conventional padded via is expanded by the dimensions of via pad 138 shown in FIG. 1A, which undesirably results in a much greater total via footprint as discussed above.

As described above, the present invention makes possible formation of vias occupying substantially less surface area of a circuit board or a die package substrate than conventional practices allow. In addition, absence of via pads permits greater signal routing flexibility and efficiency on the surface of the circuit board or die package substrate. As a result of the present invention, greater device, component, and/or die densities can be achieved on comparable surface areas. Alternatively, existing device, component, and/or die densities and their corresponding connection densities can be achieved on smaller surfaces, resulting in scalable reductions in packaging size and space, with substantial associated cost savings. Although the invention is described to apply to formation of padless vias in a circuit board, it will be readily apparent to one of ordinary skill in the art how to apply the invention in similar situations, for example to a substrate of an individual die, i.e. to a "die package substrate," where reductions in surface area consumption and greater routing flexibility are desirable.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a padless via and method for making same have been described.

What is claimed is:

1. A padless via in a substrate, the padless via comprising:
a via hole having an inner wall, the inner wall having a conductive lining, the conductive lining defining an inner conductive ring at a surface of the substrate, the conductive lining comprising a seed layer on a surface of the inner wall and a differentially-plated plating layer on a surface of the seed layer,
wherein the inner conductive ring is in direct electrical contact with conductive tracings on the surface of the substrate,
wherein at least one of the conductive tracings comprises a blanket metal layer on the surface of the substrate, the seed layer on a surface of the blanket metal layer, and the differentially-plated plating layer on the surface of the seed layer, and
wherein a thickness of the differentially-plated plating layer of the conductive tracing is different from a thickness of the differentially-plated plating layer of the conductive lining.

2. The padless via of claim 1, wherein the substrate is a circuit board.

3. The padless via of claim 1, wherein the substrate is a die package substrate.

4. The padless via of claim 1, wherein the via hole is partially filled with the conductive lining.

5. The padless via of claim 1, wherein the conductive lining comprises copper.

6. The padless via of claim 1, wherein the conductive lining comprises a copper alloy.

7. The padless via of claim 1, wherein the conductive lining is formed by differential plating performed by addition of an organic suppressant to a plating bath.

8. A semiconductor device comprising:
a substrate having a substrate surface;
a via hole extending through the substrate surface and defined by an inner wall, the via hole having a via hole diameter;
a padless via comprising:
a conductive lining along the inner wall and extending from the inner wall, the conductive lining defining an inner conductive ring, the inner conductive ring having an outer diameter, the via hole diameter equal to the outer diameter, the conductive lining comprising a seed layer on a surface of the inner wall and a differentially-plated plating layer on a surface of the seed layer; and
a conductive tracing on the substrate surface and connected to the inner conductive ring, the conductive tracing comprising a blanket metal layer on the substrate surface, the seed layer on a surface of the blanket metal layer, and the differentially-plated plating layer on the surface of the seed layer.

9. The semiconductor device of claim 8, wherein the conductive tracing extends to the inner wall.

10. The semiconductor device of claim 8, wherein a thickness of the differentially-plated plating layer of the conductive tracing is different from a thickness of the differentially-plated plating layer of the conductive lining.

11. The semiconductor device of claim 8, wherein the thickness of the differentially-plated plating layer of the conductive tracing is less than the thickness of the differentially-plated plating layer of the padless via.

12. The semiconductor device of claim 8, wherein the substrate comprises a circuit board.

13. The semiconductor device of claim 8, wherein the substrate comprises a die package substrate.

14. A semiconductor device comprising:
a substrate having a substrate surface;
a blanket metal layer on the substrate surface;
a via hole extending through the substrate surface and the blanket metal layer and defined by an inner wall, the via hole having a via hole diameter;
a seed layer on a surface of the blanket metal layer and on a surface of the inner wall;
a differentially-plated plating layer on a surface of the seed layer on the surface of the blanket metal layer and extending along the seed layer on the inner wall through the via hole, wherein a thickness of the differentially-plated plating layer on the surface of the seed layer is different from a thickness of the differentially-plated plating layer along the inner wall;
a padless via comprising:
a conductive lining comprising the seed layer and the differentially-plated plating layer, the conductive lining defining an inner conductive ring, the inner conductive ring having an outer diameter, the via hole diameter equal to the outer diameter; and
a conductive tracing on the substrate surface comprising the blanket metal layer, the seed layer, and the differentially-plated plating layer and connected to the padless via.

15. The semiconductor device of claim 14, wherein the conductive tracing extends to the inner wall.

16. The semiconductor device of claim 14, wherein the thickness of the differentially-plated plating layer on the surface of the seed layer is less than the thickness of the differentially-plated plating layer along the inner wall.

17. The semiconductor device of claim 14, wherein the substrate comprises a circuit board or a die package substrate.

* * * * *